United States Patent [19]
Yanagisawa

[11] Patent Number: 5,898,324
[45] Date of Patent: Apr. 27, 1999

[54] HIGH VOLTAGE DETECTOR CIRCUIT

[75] Inventor: Tooru Yanagisawa, Tokyo, Japan

[73] Assignee: NEC Corporation, Tokyo, Japan

[21] Appl. No.: 08/828,692

[22] Filed: Mar. 31, 1997

[30] Foreign Application Priority Data

Mar. 29, 1996 [JP] Japan ................... 8-075050

[51] Int. Cl.$^6$ ..................................... H03K 5/153
[52] U.S. Cl. ..................... 327/81; 327/80; 327/77
[58] Field of Search ....................... 327/77, 80, 81, 327/142, 143, 198, 51, 427, 434, 435, 436

[56] References Cited

U.S. PATENT DOCUMENTS

| | | | |
|---|---|---|---|
| 4,309,627 | 1/1982 | Tabata | 327/143 |
| 4,658,156 | 4/1987 | Hashimoto | 327/51 |
| 5,083,045 | 1/1992 | Yim et al. | 327/80 |
| 5,170,077 | 12/1992 | Schreck | 327/80 |
| 5,278,458 | 1/1994 | Holland et al. | 327/77 |

FOREIGN PATENT DOCUMENTS 57-190775  4/1982  Japan ..................... G01R 19/165

*Primary Examiner*—Toan Tran
*Attorney, Agent, or Firm*—Foley & Lardner

[57] ABSTRACT

For providing a high voltage detector circuit for discriminating whether a voltage supplied to an input terminal (1) is higher or not than a power supply thereof, stably independent of its power supply fluctuation or noises and without problem of gate oxide break because of high voltage; a high voltage detector circuit of the invention comprises: a MOS transistor (P1) with its gate connected to the power supply; a first resistor (R1) connected between a source of the MOS transistor and the input terminal; a second resistor (R2) connected between a drain of the MOS transistor and a ground; and an inverter for outputting inverse logic of a drain voltage of the MOS transistor to an output terminal (OUT).

2 Claims, 1 Drawing Sheet

5,898,324

HIGH VOLTAGE DETECTOR CIRCUIT

BACKGROUND OF THE INVENTION

The present invention relates to a high voltage detector circuit, and particularly to that for discriminating whether voltage impressed to its input terminal is higher or not than power supply voltage thereof.

An LSI (Large Scale Integrated circuit) having a rewritable non-volatile memory is provided with a variable voltage supply Vpp which supplies a high voltage (about 12 to 15V) when writing or erasing the non-volatile memory and a low voltage having the same voltage level (about 3 to 5V) as an ordinary power supply Vcc when reading out the non-volatile memory. The non-volatile memory is set either in write mode or in read-out mode according the output of a high voltage detector circuit provided in the LSI for discriminating whether the variable voltage supply Vpp supplied to its input terminal is higher or not than the voltage level of the power supply Vcc.

As a prior art of the high voltage detector circuit, there is a circuit configuration disclosed in a Japanese patent application laid open as a Provisional Publication No. 190775/'83.

FIG. 3 is a circuit diagram illustrating the high voltage detector circuit of the prior art, comprising a serial connection of a pMOS transistor P1 and an nMOS transistor N1 connected between a ground and an input terminal 1 where a variable voltage supply Vpp is impressed, both gates of the pMOS transistor P1 and the nMOS transistor N1 coupled to a power supply Vcc and an output OUT is obtained from connection point of the pMOS transistor P1 and the nMOS transistor N1.

When the variable voltage supply Vpp not higher than the power supply Vcc is impressed to the input terminal 1, the pMOS transistor P1 becomes OFF and the nMOS transistor N1 becomes ON, the output OUT becoming at LOW level.

When the variable voltage supply Vpp supplies the high voltage, that is, Vpp>Vcc+Vthp1, Vthp being threshold voltage of the pMOS transistor P1, both the pMOS transistor P1 and the nMOS transistor N1 become ON. So, by provided on-resistance of the pMOS transistor P1 and the nMOS transistor N1 appropriately, the output OUT is turned to HIGH level.

Thus, the variable voltage supply Vpp is discriminated whether it is higher or not than the power supply Vcc.

However, voltage level of the output OUT at HIGH level is determined by on-resistance ratio of the nMOS transistor N1 to the pMOS transistor P1 in the prior art of FIG. 3, and on-resistance of the nMOS transistor N1, the on-resistance ratio in consequence, is directly affected by voltage fluctuation of the power supply Vcc supplied to its gate. Therefore, there may be cases where the voltage level of the output OUT at HIGH level does not attain to a sufficient level because of low on-resistance of the nMOS transistor N1 when the power supply Vcc is comparatively high, resulting in malfunction of the LSI.

On the contrary, when the on-resistance of the nMOS transistor N1 is sufficiently high for preventing the above problem by making small the channel width/length ratio of the nMOS transistor N1, there arises another problem that the output OUT may become at HIGH level because of noise mingled in the variable voltage supply Vpp or leak current from the pMOS transistor P1 even when the variable voltage supply Vpp is supplying the low voltage, in case the power supply Vcc is comparatively low, resulting in malfunction too of the LSI.

There is also a problem of break of gate oxide of the pMOS transistor P1 caused by the high voltage impressed to the input terminal 1.

SUMMARY OF THE INVENTION

Therefore, a primary object of the present invention is to provide a high voltage detector circuit which is robust against noises and able to discriminate the high voltage of the variable voltage supply impressed to its input terminal stably independent of its power supply fluctuation, gate oxide of MOS transistor thereof well protected from the high voltage.

In order to achieve the object, a high voltage detector circuit of the invention, for discriminating whether a voltage supplied to an input terminal is higher or not than a power supply thereof, comprises a MOS transistor with its gate connected to the power supply, a first resistor connected between a source of the MOS transistor and the input terminal, a second resistor connected between a drain of the MOS transistor and a ground, and an inverter for outputting inverse logic of a drain voltage of the MOS transistor to an output terminal.

Therefore, the drain voltage of the MOS transistor can be controlled at an appropriate level by preparing resistance of the first and the second resistors considering voltage levels of the variable voltage supply, the power supply and their fluctuation, according to threshold voltage of the inverter.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

DETAILED DESCRIPTION OF THE PREFERRED EMBODIMENTS

Now, embodiments of the present invention will be described in connection with the drawings.

Figure 1:
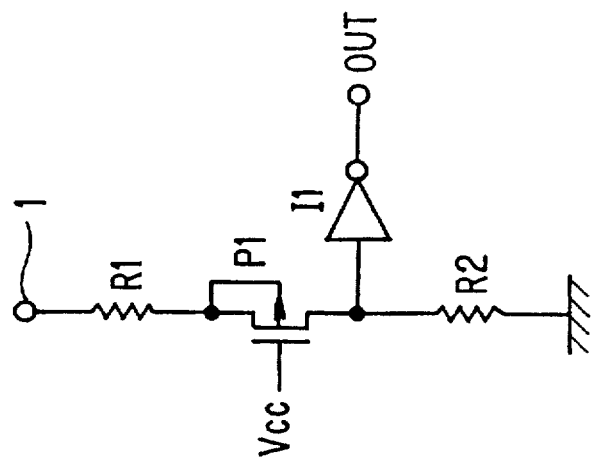
FIG. 1 is a circuit diagram illustrating a high voltage detector circuit according to an embodiment of the present invention.

FIG. 1 is a circuit diagram illustrating a high voltage detector circuit according to an embodiment of the present invention, comprising;

- an input terminal 1 wherein impressed is a variable voltage supply Vpp for supplying a high voltage having a voltage level higher than a positive power supply Vcc and a low voltage having the same voltage level as the positive power supply Vcc,
- a pMOS transistor P1 with its gate connected to the positive power supply Vcc,
- a first resistor R1 connected between the input terminal 1 and source of the pMOS transistor P1,
- a second resistor R2 connected between a ground and drain of the pMOS transistor P1, and
- an inverter I1 for outputting inverse logic of drain voltage of the pMOS transistor P1 to an output terminal OUT.

When the low voltage of the variable voltage supply Vpp having the same voltage level to the positive power supply Vcc is supplied to the input terminal 1, the pMOS transistor P1 becomes OFF with its gate connected to the positive power supply Vcc, and its drain is pulled down to the ground level through the second resistor R2. Therefore, a HIGH level is output from the output terminal OUT.

When the high voltage of the variable voltage supply Vpp is supplied to the input terminal 1, the pMOS transistor P1 becomes ON and input voltage Vi of the inverter I1 is represented by following equation (1).

$$Vi=((r2/(r1+r2))\cdot(Vpp-Vds) \quad (1)$$

where Vds represents potential difference between source and drain of the pMOS transistor P1, r1, r2 denoting resistance of the first and the second resistors R1 and R2, respectively.

From equation (1), discrimination voltage Vpc of the high voltage detector of FIG. 1, that is, voltage level of the variable voltage supply Vpp giving the threshold voltage Vt of the inverter I1 for turning output logic is represented as follows.

$$Vpc=Vds+(1+r1/r2)\cdot Vt \quad (2)$$

Therefore, the discrimination voltage Vpc of the high voltage detector can be designed in the embodiment considering sufficient margin against input noise and the power supply fluctuation referring to the threshold voltage Vt of the inverter I1, by preparing appropriate resistance ratio r1/r2 of the first and the second resistors R1 and R2, which is easily prepared with error within several % by preparing the first and the second resistors R1 and R2 with the same material, polysilicon, for instance. For example, when r1=100KΩ, r2=50KΩ, Vt=1.5V and Vds=0.1V, Vpc of 4.6V is obtained, having sufficient margin both to the high voltage of 12V and the low voltage of 3V.

Further, source voltage of the pMOS transistor P1 is dropped to Vi+Vds, that is about 4.1V with the above example, by the first resistor R1 even when the high voltage of 12V is supplied to the input terminal 1. Therefore, there is no problem of gate oxide break caused by high voltage impressed to the pMOS transistor P1, nor that of input MOS transistors of the inverter I1 caused by high level of the input voltage Vi.

By the same reason, no malfunction arises because of leak current through the pMOS transistor P1, in the embodiment.

Figure 3:
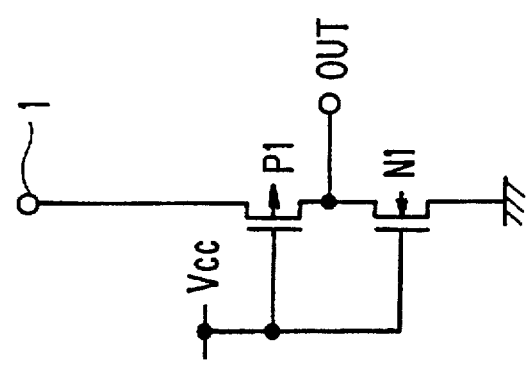
FIG. 3 is a circuit diagram illustrating the high voltage detector circuit of a prior art.

Still further, even when the pMOS transistor P1 is ON with the variable voltage supply Vpp supplying the high voltage, the through current Idc from the input terminal 1 to the ground is decreased by the first and the second resistor R1 and R2 compared to the prior art of FIG. 3, and the current consumption is economized.

Figure 2:
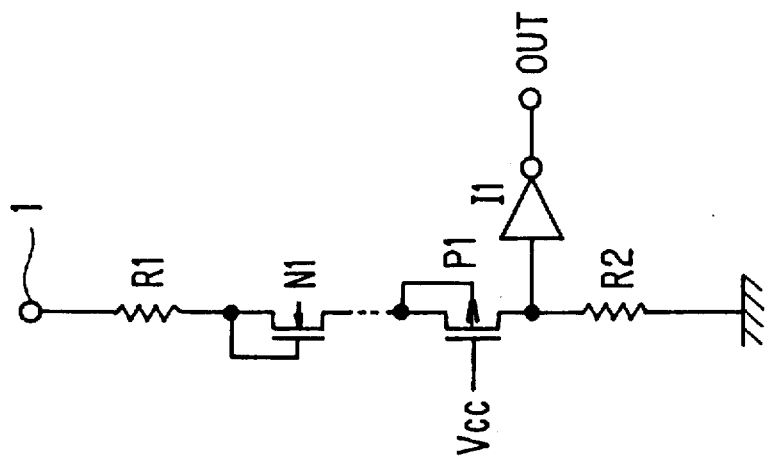
FIG. 2 is a circuit diagram illustrating another embodiment of the invention.

FIG. 2 is a circuit diagram illustrating another embodiment of the invention, comprising a serial connection of MOS transistors N1, . . . each diode connected, provided further to the embodiment of FIG. 1 between the first resistor R1 and the drain of the pMOS transistor P1.

In the embodiment of FIG. 2, the through current Idc, flowing when the high voltage of the variable voltage supply Vpp is supplied, is represented as follows.

$$Idc=(Vpp-Vds-n\cdot Vth)/(r1+r2), \quad (3)$$

n, Vt being a number of the MOS transistors N1, . . . diode connected and their threshold voltage, respectively.

As shown by the equation (3), the through current Idc can be still decreased with the same value of the first and the second resistors R1 and R2, or the same value of the through current Idc is attained with smaller resistors than those of the embodiment of FIG. 1, enabling to economize IC chip size with the same performance, in the embodiment of FIG. 2.

What is claimed is:

1. A high voltage detector circuit for detecting whether a voltage supplied to an input terminal is higher or not than a power supply thereof, comprising:

a first MOS transistor with its gate connected to the power supply;

at least one second MOS transistor and a first resistor, said first resistor serially connected to a source of said at least one second MOS transistor and provided between the source of said at least one second MOS transistor and the input terminal, wherein the at least one second MOS transistor has its gate connected to its source and its drain connected to a source of said first MOS transistor;

a second resistor connected between a drain of said first MOS transistor and a ground; and an inverter for outputting inverse logic of a drain voltage of said first MOS transistor to an output terminal.

2. A high voltage detector circuit recited in claim 1, wherein said first and said second resistors are prepared of the same material.

* * * * *